United States Patent [19]

Marshall et al.

[11] Patent Number: 5,016,965

[45] Date of Patent: May 21, 1991

[54] OPTICAL PACKAGE

[75] Inventors: Ian W. Marshall, Woodbridge; Philip D. Constantine, Ipswich, both of England

[73] Assignee: British Telecommunications public limited company, United Kingdom

[21] Appl. No.: 435,400

[22] PCT Filed: Oct. 7, 1988

[86] PCT No.: PCT/GB88/00842

§ 371 Date: Nov. 13, 1989

§ 102(e) Date: Nov. 13, 1989

[87] PCT Pub. No.: WO89/03539

PCT Pub. Date: Apr. 20, 1989

[30] Foreign Application Priority Data

Oct. 8, 1987 [GB] United Kingdom ............... 8723595

[51] Int. Cl.[5] .................................................. G02B 6/32
[52] U.S. Cl. ................................. 350/96.18; 350/96.20
[58] Field of Search ............ 350/96.10, 96.15, 96.18, 350/96.20, 96.21, 96.22

[56] References Cited

U.S. PATENT DOCUMENTS

| | | | |
|---|---|---|---|
| 3,506,835 | 4/1970 | Foster | 250/199 |
| 3,656,832 | 4/1972 | Judin | 350/96.10 |
| 3,829,195 | 8/1974 | Rawson | 350/96.18 |
| 4,211,968 | 7/1980 | Steensma | 350/96.10 |
| 4,263,506 | 4/1981 | Epstein | 250/231 SE |
| 4,507,775 | 3/1985 | Sheem | 370/4 |
| 4,705,351 | 11/1987 | Toda | 350/96.18 |
| 4,729,630 | 3/1988 | Martinez | 350/96.29 |
| 4,767,171 | 8/1988 | Keil | 350/96.18 |
| 4,778,238 | 10/1988 | Hicks | 350/96.16 |
| 4,807,956 | 2/1989 | Tournereau et al. | 350/96.20 |
| 4,842,391 | 6/1989 | Kim et al. | 350/96.18 |

FOREIGN PATENT DOCUMENTS

| | | | |
|---|---|---|---|
| 1106-485 | 8/1981 | Canada | 350/96.18 |
| 0057164 | 4/1982 | European Pat. Off. | 350/96.18 |
| 0119116 | 9/1984 | European Pat. Off. | 350/96.18 |
| 0177104 | 1/1985 | European Pat. Off. | |
| 0141697 | 5/1985 | European Pat. Off. | 350/96.18 |
| 0226881 | 7/1987 | European Pat. Off. | 350/96.18 |
| 3431738 | 3/1986 | Fed. Rep. of Germany | |
| 0608812 | 1/1985 | Japan | |
| 60-61707 | 9/1985 | Japan | |
| 2002136A | 2/1979 | United Kingdom | 455/617 |
| 2077943A | 12/1981 | United Kingdom | 350/96.18 |
| 2139780A | 11/1984 | United Kingdom | 455/606 |
| 2158605A | 11/1985 | United Kingdom | 350/96.18 |

OTHER PUBLICATIONS

"Machine Design", vol. 57, No. 18, Aug. 1985, (Cleveland, Ohio, U.S.), Multipart Micro-Optics Cut Switching Losses, p. 38.

Olsson et al., "High-Sensitivity Direct-Detection Receiver With A 1.5 µm Optical Preamplifier", *Electronics Letters*, vol. 22, No. 21, p. 1114, Oct. 1986.

Yamamoto et al., "Optical Receiver Sensitivity Improvement by a Semiconductor Laser Preamplifier", *Electronics Letters*, vol. 16, No. 6, p. 233, Mar. 13, 1980.

Mukai et al., "Gain, Frequency Bandwidth, and Saturation Output Power of AlGaAs DH Laser Amplifiers", *IEEE Journal of Quantum Electronics*, vol. QE-17, No. 6, p. 1028, Jun. 1981.

Mukai et al., "S/N and Error Rate Performance in AlGaAs Semiconductor Laser Preamplifier and Linear Repeater Systems", *IEEE Transactions on Microwave Theory and Techniques*, vol. MTT-30, No. 10, p. 1548, Oct. 1982.

O'Mahony et al., "Wideband 1.5 µm Optical Receiver Using Travelling-Wave Laser Amplifier", *Electronics Letters*, vol. 22, No. 23, p. 1238, Nov. 6, 1986.

Bar-Chaim et al., "Integrated Optoelectronics", *IEEE Spectrum*, vol. 19, No. 5, p. 37, May 1982.

(List continued on next page.)

Primary Examiner—Akm Ullah
Attorney, Agent, or Firm—Nixon & Vanderhye

[57] ABSTRACT

A lens assembly for focussing the light output of a device (2) on to a target (4), when there is relative movement between the target and device. The assembly comprises a pair of lenses with the device at the focus of the first and the target in the focal range of the second lens.

9 Claims, 1 Drawing Sheet

OTHER PUBLICATIONS

Okada et al., "Baseband Response Characteristics Measurement Method and Measuring Equipment for Multimode Fiber", *Electronics and Communications in Japan*, Part 1, vol. 68, No. 1, p. 82, 1985.

Favre et al., "High Frequency Stability of Laser Diode for Heterodyne Communication Systems", *Electronics Letters*, vol. 16, No. 18, p. 709, Aug. 28, 1980.

Lens Assembly, Document, vol. 9, No. 122, (P359) [1845], May 28, 1985.

Optical Coupling Method, Document, vol. 9, No. 195, (P-379), [1918], Aug. 13, 1985.

OPTICAL PACKAGE

BACKGROUND OF THE INVENTION

This invention relates to optical coupling.

In various opto-electronic and electro-optical assemblies it is necessary to align elements of the assembly so that light output from one element is input to another element. If the light emitting element emits a diverging beam then in order to couple a substantial portion into the light receiving element it is necessary to position the light receiving facet of the receiving element close to the light emitting facet of the emitting element. In some instances this close positioning cannot be achieved: for example if the light emitting element is on a support that is subject to movement such as thermal expansion or vibration and the light receiving element is such that it can not be flexibly mounted then it becomes difficult to mount the light receiving element sufficiently close to the light emitting element without impariing the performance of the light receiving element. If a common support is used a flexible connection is required between the receiver and the package wall which would restrict the bandwidth due to the effects of parasitic capacitances and/or inductances inherent in a flexible connection. On the other hand mounting the receiving element off the transmitting element support increases the distance between the elements and also introduces alignment problems caused by the relative movement of the elements.

SUMMARY OF THE INVENTION

The present invention provides a device package comprising a light emitting element supported on a first mounting and a light receiving element supported on a second mounting and in which, when operating, relative movement occurs between the light emitting element and the light receiving element, and a lens assembly supported on said first mounting for directing light from the light emitting element on to the light receiving element, the lens assembly comprising a first lens located with the light emitting element at its focus and a second lens aligned with the first lens and with the light receiving element located within the focal range of the second lens.

The first element may be a light generating element or may be a light processing element. Within the context of this specification, the expression 'light emitting element' means having a light output and includes elements that process a light input without generation of light. The first element may be a light source without an optical input or may have an optical input provided by a fibre or a previous optical element.

BRIEF DESCRIPTION OF THE DRAWINGS

The invention is now described by way of example with reference to the accompanying drawings in which.

DETAILED DESCRIPTION OF EXEMPLARY EMBODIMENTS

Figure 1:
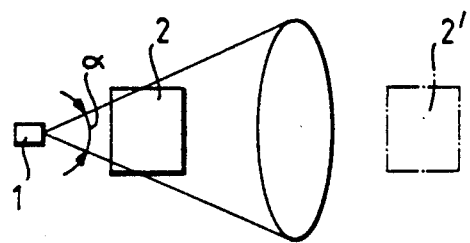
FIG. 1 is a schematic illustration of light output from a light emitting element.

Referring now to FIG. 1, a light emitting element 1 emits a cone of light having an apex angle $\alpha$. The light emitting element 1 envisaged by the present invention may be a source device such as a modulated laser transmitter or a signal processing element such as a filter or a laser amplifier that receives an optical signal as well as emitting light. (Within the context of this specification the expressions optical, light, elecro-optical and opto-electronic should be construed to relate not only to the visible spectrum but also the near and far infra red and the ultra violet regions of the electromagnatic spectrum). If the element 1 is a semiconductor laser then the angle $\alpha$ will typically be in the range of 20° to 60°. Due to the divergence of the output light any element into which it is to be directed needs to be positioned sufficiently close to collect a substantial proportion of the output light if the coupling is to be efficient.

Thus if a photodiode, for example, with a light receiving facet of 100 $\mu$m is to receive the light output of the element 1 it needs to be located in the position shown at 2 rather than at position at 2'. If either the light receiving element 2 or the light emitting element 1 requires rigid mounting for electrical connection purposes and the other element is moving or moveable due, for example, to thermal expansion or a requirement for a shock absorbing mounting, alignment is made more difficult due to the relative movement between the elements. In a preferred application of the invention the light emitting element 1 is a laser amplifier and the light receiving element is a photodiode. For use at high frequencies the photodiode requires rigid electrical connection in order to avoid inductive or capacitative restriction of bandwidth, and in order to maintain a stable operating temperature despite variation in ambient temperature, the laser amplifier is mounted on a Peltier cooler. It is desirable to have the Peltier cooler within the package and responding to a smaller thermal mass rather than having the complete package on a Peltier cooler because such an external Peltier cooler would need much more accurate and rapid control in view of the larger thermal mass and time taken to correct for temperature changes. Putting the Peltier cooler within the package as part of the laser support means that the photodiode can not be mounted on the same support because of the movement caused by the Peltier cooler and the required rigid electrical connection of the photodiode.

Figure 2:
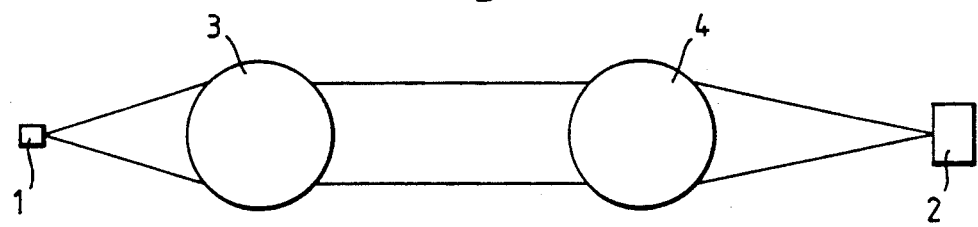
FIG. 2 is a schematic illustration of a lens assembly used in a preferred embodiment of the invention.

FIG. 2 shows schematically an embodiment of a lens arrangement that is used in the invention to focus the output of a light emitting element 1 on to a remotely located receiving element 2.

The lens arrangement comprises two spherical lenses having focal lengths generally in the range of 100 $\mu$m to 500 $\mu$m and preferably about 150 $\mu$m to 250 $\mu$m. These lenses have high refractive indexes, generally in the range of 1.5 to 2.2, and are anti-reflection coated. For a target facet of 100 $\mu$m on the element 2, spherical lenses of refractive index 2, focal length of 200 $\mu$m and a lens diameter of 2 mm have been found satisfactory. The first lens 3 is located a focal length from the light emitting element 1, so that a collimated or substantially parallel beam emerges from the lens 3 directed towards the second lens 4. At the second lens 4 the collimated beam is focussed back to a spot. Due to spherical aberration the beam is not focussed to a unique focus, but a range of foci depending upon the passage through the lens. This range of foci also has superimposed upon it other variables such as asymmetry in the output of the emitting element 1 and the presentation geometry of the receiving element which may be inclined in order to prevent reflection back to the emitting element 1. For these reasons the best location for the receiving element 2 is found empirically by sweeping it through a range of locations around the focal distance from the second lens. When this is done it is generally found that at a distance larger than the nominal focal length there is a range of locations at which the spot size is well within the size of the target facet and the received intensity is at a constant maximum. Outside this range the spot size increases and the intensity of light that is collected falls off. The target facet of the receiving element 2 is then positioned in the centre of this range of locations for the constant maximum, termed herein the 'focal range'.

The lenses 3 and 4 may conveniently be positioned and secured using the following technique. A flat substrate which conveniently could be a glass slide is used as the reference surface to which the lenses will be secured. The height of the lenses above the glass slide is determined first, using active alignment. Each lens is separately positioned and secured to the side of an associated small, typically 3 mm side (for 2 mm lenses), glass cube. The lenses are secured to their respective glass cube using a tough epoxy resin. When this adhesive has cured, the glass cubes or blocks are accurately positioned and secured to the glass slide again using a tough epoxy resin.

We have discovered that despite the glass slide and blocks being smooth and flat enough on the macroscopic scale to facilitate accurate positioning of the optical system, the microscopic surface roughness enables the blocks to be secured to the slide with adhesive, the adhesive lying between the bonded surfaces of the slide and the blocks, without the height of the lenses being materially affected. To ensure that excessive adhesive is excluded, the blocks should initially be pushed against the slide. Since only thin layers of adhesive need be used in each of the aforementioned steps, the position of the lenses is not noticeably affected by adhesive shrinkage. In this way we repeatedly achieve positioning accuracies to within 1 $\mu$m, without the need for accurately machined components. Once the positions of the lenses have been fixed by securing the blocks, further adhesive can be added, around the bases of the lenses for example, without the risk that adhesive shrinkage will upset alignment. This technique can also be used where solders are used in place of the adhesives. Preferably a glass-wetting solder is used, alternatively the slide and blocks may be metallised. To facilitate manipulation and positioning of the lenses, a further, smaller glass block of the like may be secured to each of the lenses out of the beam path using a hard setting epoxy resin. After positioning and securing the lenses, the now redundant smaller glass blocks may be knocked off.

Figure 3:
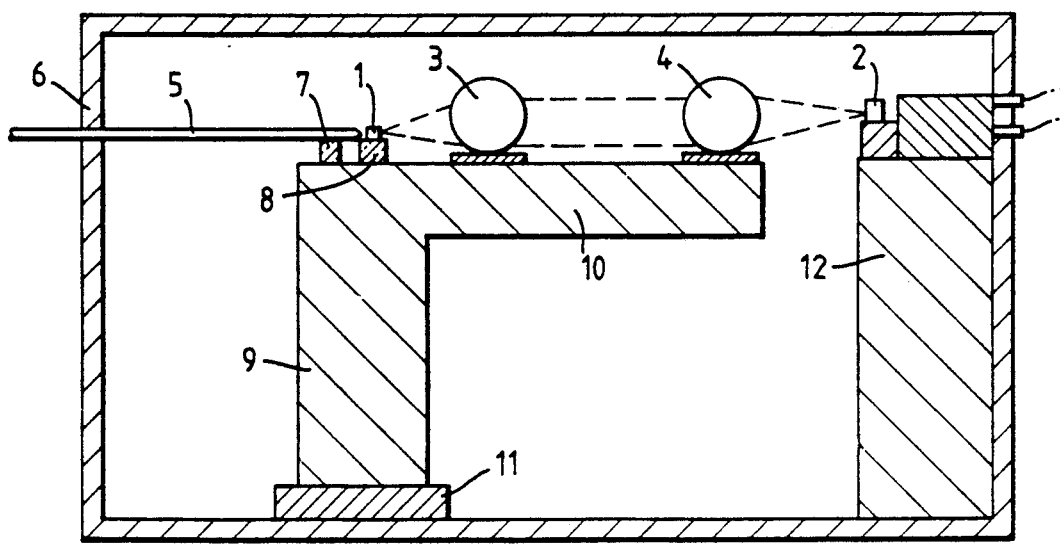
FIG. 3 is a schematic cross section through a preferred embodiment of device package according to the invention.

FIG. 3 shows in more detail a package incorporating the lens assembly of FIG. 2. The emitting element 1 is a laser amplifier and the receiving element 2 is a PIN diode. A tapered, lensed fibre 5 enters through a feedthrough in an outer package wall 6, is supported on a glass bead 7 and is positioned close to the input port of a semiconductor travelling wave amplifier 1. The output beam from the laser is focussed via lenses 3 and 4 on to the light receiving facet of PIN diode 2. Exemplary spacings for the assembly are 200 $\mu$m between the laser 1 and lens 3, 5 mm between lenses 3 and 4 and 300 $\mu$m between lens 4 and diode 2. The laser chip is mounted on a mounting block 8 which is attached to a brass block 9 that has a shelf 10 on which the lenses 3 and 4 are carried. Since the laser output is temperature sensitive the brass block 9 is mounted on a Peltier cooler 11 that retains the temperature at a preselected operating value (eg 25° C.) irrespective of changes in ambient temperature. The Peltier cooler is subject to thermal expansion and contraction during operation and this causes beam waiver as this motion is transmitted to the laser. However, it has been found that the movement of the spot on the target face of the PIN diode due to beam waiver can be tolerated because the lens focussing arrangement maintains the spot within the target area. This arrangement enables use of a within package Peltier cooler which can therefore be smaller and have a smaller time constant than would a Peltier cooler for the complete package. The PIN diode can not be mounted on the Peltier cooler (or on the attached brass block 9, 10) because it needs to be rigidly connected to the package for high frequency response, and so it is mounted on its own support 12 along with the receiver electronics (not shown) which in the case of a laser preamplifier receiver may be a wideband low impedance amplifier or a high impedance amplifier.

The comparatively large size of the first lens 3, compared with a photodiode facet, means that it can be positioned further from the laser than the photodiode would need to be. In practice the only way to locate a PIN diode sufficiently close to a laser amplifier in a receiver preamplifier would be to fabricate them on the same chip, but this would introduce the flexible connection requirement. In manufacture of the device shown in FIG. 3 the first lens 3 needs to be located with the centre of the lens centred on the axis of the laser and photodiode, a typical location accuracy being about 1 $\mu$m. If the first lens is positioned slightly incorrectly, for example with an error of $\pm 2$ $\mu$m, this can be compensated for in the location of the second lens. Since the photodiode facet is much larger than the laser facet the alignment accuracy of the second lens 4 is less stringent, about 10 $\mu$m for a 100 $\mu$m facet or about 3 to 5 $\mu$m if a compensation for a first lens misplacement has to be made, and thus the alignment procedure during manufacture is more flexible than a close proximity laser photodiode alignment would be. The lens is also much larger than the photodiode facet which again eases alignment.

The lenses 3 and 4 may be spaced more closely, but with the spacing given another optical element may be interposed between the lenses, taking advantage of the presence of the collimated beam. For example with a high impedance receiver amplifier a shutter, edge filter or band pass filter may be included, or a polariser may be inserted with either low or high impedance amplifiers. The performance of band pass filters, polarisers and optical isolators is greatly improved with a collimated beam. The filter or other optical element and the photodiode 2 are inclined with respect to the beam axis in order to avoid reflecting light back into the laser. The lenses need not be spherical lenses, one or both of the lenses could be replaced by rod lenses, preferably plano-convex rod lenses. The lenses may also be of different sizes, the actual lens sizes and relative sizes being determined by the spot size required and the aberration that can be tolerated. If the second lens is larger than the first then the spot is magnified, whereas if the second lens is smaller than the first the spot size is reduced. Smaller lenses also exhibit smaller aberration which also minimises spot size. With the lenses described in the embodiment of FIG. 3 coupling between the laser and the PIN diode can be achieved with a loss of 0.5 dB or less.

A comparable assembly to that described for a laser amplifier and photodiode may be utilised for other elements 1 and 2. For example other signal processing stages prior to receiving such as tunable filters or signal shaping may replace the laser amplifier, or be used in sequence with a laser amplifier. The invention is particularly useful where the mounting criteria of the elements lead to relative movement being experienced between the elements. The assembly also enables the elements to be relatively remote.

We claim:

1. A device package comprising:
   a light emitting element supported on a first mounting;
   a light receiving element supported on a second mounting;
   said light emitting element and said light receiving element having; when operating, relative movement therebetween; and
   a lens assembly supported on said first mounting for directing light from the light emitting element on to the light receiving element, the lens assembly including a first lens located with the light emitting element at its focus and a second lens aligned with the first lens and with the light receiving element located within the focal range of the second lens.

2. A device package according to claim 1 in which the lenses are spherical lenses.

3. A device package according to claim 1 in which one of the elements is mounted on a Peltier cooler.

4. A device package according to claim 1 in which the light emitting element comprises a laser amplifier.

5. A device package according to claim 1 in which the light receiving element comprises a photodiode.

6. A device package according to claim 1 in which one of the elements is mounted on a shock absorbing mounting.

7. A device package as in claim 1 including a laser preamplifier receiver assembly.

8. A device package as in claim 1 including a receiver assembly.

9. A light signal processing device package comprising:
   a first mount structure,
   a second mount structure,
   said first and second mount structures being disposed to permit relative movement therebetween;
   a first light signal processing device fixedly disposed on said first mount structure;
   a second light signal processing device fixedly disposed on said second mount structure; and
   a lens assembly having at least two optical lenses fixedly disposed on said first mount structure and located to optically couple light signals between said first and second light signal processing devices.

* * * * *